United States Patent [19]

Keir

[11] Patent Number: 5,576,943
[45] Date of Patent: Nov. 19, 1996

[54] SOFT SWITCHED THREE PHASE INVERTER WITH STAGGERED RESONANT RECOVERY SYSTEM

[75] Inventor: Alexander S. Keir, Chelmsford, Mass.

[73] Assignees: Kaman Electromagnetics Corporation, Hudson, Mass.; Newport News Shipbuilding and Dry Dock Company, Newport News, Va.

[21] Appl. No.: 445,690

[22] Filed: May 22, 1995

[51] Int. Cl.$^6$ .................................... H02H 7/122
[52] U.S. Cl. .................................. 363/56; 363/132
[58] Field of Search .................... 363/56, 132

[56] References Cited

U.S. PATENT DOCUMENTS

| | | | |
|---|---|---|---|
| 4,336,587 | 6/1982 | Boettcher, Jr. et al. | 363/134 |
| 4,639,849 | 1/1987 | Noworolski et al. | 363/56 |
| 4,691,270 | 9/1987 | Pruitt | 363/56 |
| 4,922,401 | 5/1990 | Lipman | 363/58 |
| 5,130,917 | 7/1992 | Shekhawat | 363/56 |
| 5,172,309 | 12/1992 | DeDoncker et al. | 363/132 |
| 5,459,655 | 10/1995 | Mori et al. | 363/132 |

OTHER PUBLICATIONS

The Auxillary Resonant Commutated Pole Converter by R. W. DeDoncker and J. P. Lyons from IEEE,90/CH2935-5/90/0000-1228501.000 1990.
Resonant Snubbers With Auxilliary Switches by W. McMurray from IEEE, 89CH2792-0/89/0000-0829501.00 1989.

*Primary Examiner*—Stuart N. Hecker
*Attorney, Agent, or Firm*—McCormick, Paulding & Huber

[57] ABSTRACT

A resonant recovery circuit operates to discharge switching energy losses stored in a snubber capacitor associated with each pole of an inverter to return the discharged current to the DC supply by means of an inductor coupled to the resonant recovery switch. In a multiple pole inverter, the snubber capacitors associated with each of the pole's switching devices is sequentially discharged during the clock cycle of the switching frequency. A plurality of recovery circuits may be used in a multi-phase inverter.

10 Claims, 7 Drawing Sheets

FIG. 2a
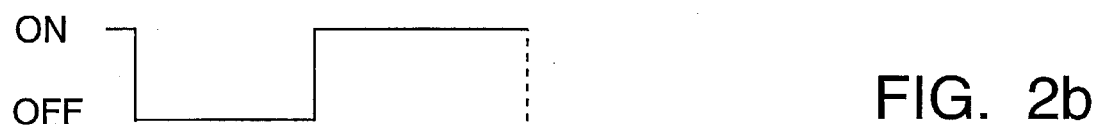
FIG. 2b
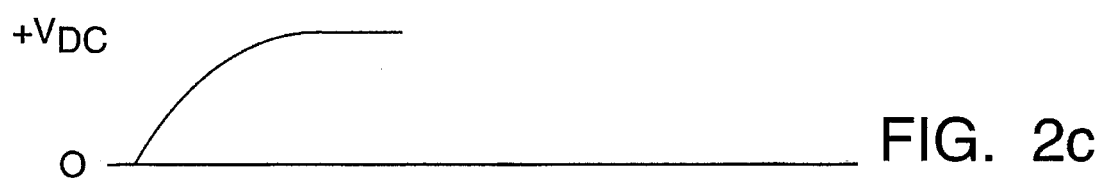
FIG. 2c
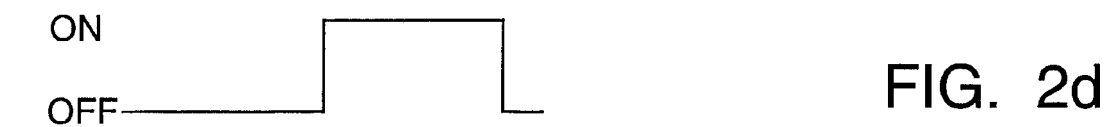
FIG. 2d
FIG. 2e
FIG. 2f
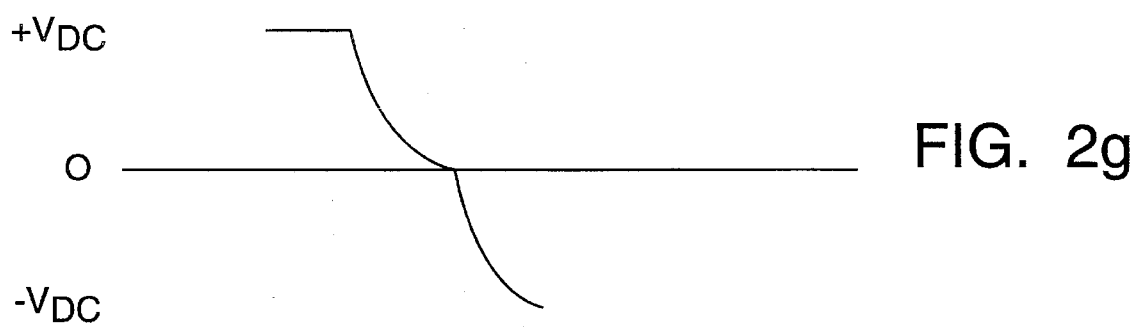
FIG. 2g
FIG. 2 ized in size than a single inductor.
SOFT SWITCHED THREE PHASE INVERTER WITH STAGGERED RESONANT RECOVERY SYSTEM The Government has rights in this invention pursuant to Contract No. N00024-92-C-4207 awarded by the United States Navy.

BACKGROUND OF THE INVENTION

The present invention relates generally to power conversion systems and deals more particularly with a DC-to-AC high power inverter having a staggered resonant recovery system to recover switching energy losses for return to the DC voltage supply.

It is usual for high power inverters to operate at frequencies much higher than the required frequency of the output voltage. In motor drives, for example, the output voltage of the inverter can be varied in a series of small steps to create the desired voltage waveshape. Typically, the output voltage waveshape is sinusoidal with the inherent motor inductance being used to filter out the high frequency components of the output voltage. In utility voltage supply inverters, the high frequency filtering of the output voltage is generally provided by separate inductors which at high frequencies are inherently smaller in size than a single inductor.

Multiple power semiconductor switching devices are used to achieve higher power output from the inverter since each of the multiple switching devices can have a lower rating because all handle a portion of the current supplied to the load rather than all of the current. One known technique employing multiple power semiconductor switching devices in a high power inverter utilizes a staggered pole(s) in unipolar and bipolar configurations wherein each pole or pair of poles has a separate load inductor, and the switching or current handling is distributed substantially evenly among the poles throughout the high frequency period.

One limitation of the foregoing staggered pole approach is due to the switching losses that occur in the semiconductor switching devices. The semiconductors are subject to switching losses which are proportional to the switching frequency and such losses are often greater than conduction losses in high frequency applications. Techniques to reduce the switching losses are known as soft switching and use of such techniques lower the operating temperature output. Such soft switching techniques for a given inverter module include auxiliary resonant commutated pole (ARCP) and a diode/capacitor snubber circuit across each semiconductor switching device.

The ARCP technique enables zero turn-off loss of the main switching device by the addition of an auxiliary triggered resonant commutation snubber circuit to commutate the load current from a main diode to another active semiconductor device. The ARCP technique requires another semiconductor switching device with substantially the same peak current rating as the main semiconductor switching device and does not lend itself to assisting multiple commutations because the peak current of the resonant pole must be distributed among the main semiconductor switching devices.

The diode/capacitor snubber circuit technique maintains a low voltage across the semiconductor switching device while the device turns-off and the current decays. If the capacitor is large enough to maintain less than the supply voltage for the entire turn-off period, the capacitor must continue to carry load current until the capacitor voltage reaches the magnitude of the supply voltage. This technique results in storing substantially more energy in the capacitor than the switching losses saved. Furthermore, the energy stored in the capacitor must be dissipated or converted by means of another switching converter to the output voltage or to the DC voltage supply bus.

The above disadvantages are solved with a staggered resonant recovery circuit of the present invention which provides a means for recovering most of the energy stored in the snubber capacitor by reversing the snubber capacitor voltage with respect to the midpoint of the DC voltage supply and returning the stored energy to the DC voltage supply.

A further advantage of the staggered resonant recovery circuit of the present invention is one inductor may operate with multiple capacitor/diode snubber circuits to provide a soft reverse recovery for the positive and negative switching devices in one phase of the power inverter returning most of the switching energy losses to the output voltage or to the DC supply bus thus significantly improving the form factor of the inductor current.

SUMMARY OF THE INVENTION

A resonant recovery circuit returns semiconductor switching device loss energy from a snubber circuit of a DC to AC inverter to a DC voltage supply potential powering the semiconductor switching device. The recovery circuit comprises a recovery circuit per phase signal output of a DC to AC inverter including a first controllable semiconductor recovery switch means having a conductive state and non-conductive state, a second controllable semiconductor recovery switch means having a conductive state and non-conductive state, and a split DC voltage supply means for supplying a positive DC voltage bus and a negative DC voltage bus relative to the positive DC voltage bus. The first and second recovery switch means are connected in a series circuit arrangement between the positive and negative DC voltage buses, respectively and define a junction at the connection between the first and second recovery switches. A capacitor divider circuit means is connected between the positive and negative DC voltage buses, respectively, and comprises a first and second capacitor in a series circuit arrangement defining a junction at the connection between the first and second capacitor. A recovery inductor is connected between the recovery switches junction and the capacitors junction. First and second sets of diode means are provided where each set of diode means is configured to return energy to the DC bus line from a power pole of a DC to AC inverter. The actuation of the power poles is staggered from one another to efficiently recover energy generated by switching losses within each power pole. Each set of diode means per power pole comprises a first recovery diode means coupled between a first snubber capacitor of a first snubber circuit associated with a first semiconductor power pole switching device and the first recovery switch means for discharging the first snubber capacitor through the recovery inductor when the first recovery switch means is made conductive by switch control circuitry which is timed so that a first pulse of current is delivered to the junction of the first and second switching capacitors to be returned to the DC voltage buses during a positive half cycle of the AC output of the inverter. A second recovery diode means is coupled between a second snubber capacitor of a second snubber circuit associated with a second semiconductor power pole switching device and the second recovery switch means for discharging the second snubber capacitor through the recovery inductor when the second recovery switch means is made conductive by switch control circuitry which is timed so that a second pulse of current is delivered to the junction of the first and second capacitors to be returned to the DC voltage buses during a negative half cycle of the AC output of the inverter. The first recovery switch means is conductive when the secondary recovery switch means is non-conductive and the first recovery switch means is non-conductive when the second recovery switch means is conductive.

Another resonant recovery circuit is also provided for use in a multi-phase DC-to-AC high power inverter of the type having "M" phase inverters wherein each of the "M" phase inverters has "N" poles each of which poles include at least one controllable power semiconductor switching device and an associated snubber circuit for storing switching loss energy of the semiconductor switching device. The recovery circuit comprises a first controllable semiconductor recovery switch means having a conductive state and non-conductive state. A second controllable semiconductor recovery switch means has a conductive state and non-conductive state. Diode means is connected one-for-one with a respective snubber circuit associated with the controllable semiconductor switching device of each of the "N" poles of one phase inverter of the "M" phase inverters. The diode means is connected to the first and second recovery switch means such that a snubber capacitor discharges through its associated diode when one of the first and second recovery switch means is made conductive at the same time that a controllable semiconductor switching device of the corresponding pole of the "N" poles is made conductive. The first recovery switch means is operable to discharge a snubber capacitor of a snubber circuit corresponding to the controllable semiconductor switching device conducting a positive polarity voltage to the output of the inverter and the second recovery switch means is operable to discharge a snubber capacitor of a snubber circuit corresponding to the controllable semiconductor switching device conducting a negative polarity voltage to the inverter output. A split DC voltage supply means is provided for supplying a DC voltage potential to a positive DC voltage bus and a negative DC voltage bus, respectively. A capacitor divider circuit means is connected between the positive and negative DC voltage buses, respectively. The capacitor divider circuit means further comprises a first and second capacitor in a series circuit arrangement, and defines a junction at the connection between the first and second capacitor. A first inductor is coupled to the first and second recovery switches and to the capacitor divider circuit for delivering a pulse of current to the capacitor divider circuit each time one of the snubber capacitors is discharged.

A three phase DC-to-AC power inverter is provided having a resonant recovery circuit comprises three DC-to-AC power inverters each producing an output AC voltage phase shifted equally from one another. Each of the inverters comprises a split DC voltage supply means for supplying a positive DC voltage bus and a negative DC voltage bus. "N" inverter poles comprise first and second controllable semiconductor switching devices connected in series between the positive and negative DC voltage buses. The first and second controllable semiconductor switching devices have a common output connection defining a voltage output. Snubber circuit means is associated one-for-one with each of the first and second controllable semiconductor switching devices of the "N" poles for storing semiconductor switching loss energy. A first controllable semiconductor recovery switch means is provided having a conductive state and non-conductive state. A second controllable semiconductor recovery switch means is provided having a conductive state and non-conductive state. Diode means is connected one-for-one with a respective snubber circuit associated with the controllable semiconductor switching device of each of the "N" poles of the inverter. The diode means is connected to the first and second recovery switch means such that a snubber capacitor discharges through its associated diode when one of the first and second recovery switch means is made conductive at the same time that a controllable semiconductor switching device of the corresponding pole of the "N" poles is made conductive. The first recovery switch means is operable to discharge a snubber capacitor of a snubber circuit corresponding to the controllable semiconductor switching device conducting a positive polarity voltage to the output of the inverter and the second recovery switch means is operable to discharge a snubber capacitor of a snubber circuit corresponding to the controllable semiconductor switching device conducting a negative polarity voltage to the inverter output. The controllable semiconductor switching devices associated with each of the "N" poles becomes conductive sequentially at predetermined timed intervals during a conduction period of the first and second recovery switch means. An inductor is provided having one end coupled to the first and second recovery switches. A capacitor divider circuit means is connected between the positive and negative DC voltage buses, respectively. The capacitor divider circuit means further comprises a first and second capacitor in a series circuit arrangement and defines a junction at the connection between the first and second capacitors wherein the opposite end of each of the inverter inductors is connected to the capacitor junction to deliver in a staggered time sequence a pulse of current to the capacitor divider circuit each time one of the snubber capacitors is discharged.

Yet another resonant recovery circuit is provided for returning semiconductor switching device loss energy from a snubber circuit to a DC voltage supply potential powering the semiconductor switching device. The recovery circuit comprises a split DC voltage supply means for supplying a positive DC voltage bus and a negative DC voltage bus. A first controllable semiconductor recovery switch means includes a first terminal connected to the positive DC voltage bus, and includes a second terminal. The first recovery switch has a conductive state and non-conductive state. A second controllable semiconductor recovery switch means includes a first terminal connected to the negative DC voltage bus, and includes a second terminal. The second recovery switch has a conductive state and non-conductive state. A first recovery diode has a cathode connected to the second terminal of the first recovery switch, and has an anode connected to the negative DC voltage bus. A second recovery diode has an anode connected to the second terminal of the second recovery switch, and has a cathode connected to the positive DC bus. A first snubber capacitor has first and second terminals. The first terminal is connected to the positive DC voltage bus. A first snubber diode includes an anode connected to the second terminal of the first snubber capacitor at a first junction. The first terminal of the first snubber capacitor and the cathode of the first snubber diode are to be respectively connected to terminals of a first controllable switching device. A second snubber capacitor has first and second terminals. The first terminal is connected to the negative DC voltage bus. A first snubber diode includes an cathode connected to the second terminal of the second snubber capacitor at a second junction. The first terminal of the second snubber capacitor and the anode of the second snubber diode are to be respectively connected to terminals of a second controllable switching device. The cathode of the first recovery diode is connected to the anode of the second recovery diode at an output junction. A first recovery inductor is connected between the first junction and the second terminal of the first recovery switch, and a second recovery inductor is connected between the second junction and the second terminal of the second recovery switch. During a negative half cycle at the output junction, when the second switching device is turned off by control circuitry, the second snubber capacitor charges through the second snubber diode to the positive DC voltage to maintain a low voltage across the second switching device which is maintained until the next on pulse when the second switching device and the second recovery switch are turned on by control circuitry. The energy stored in the capacitor is then transferred to the second inductor such that when the energy stored in the second snubber capacitor is about equal to the energy transferred to the second inductor, the second recovery switch is turned off to allow the energy originally stored in the second snubber capacitor to be transferred to the DC supply. During a positive half cycle at the output junction when the first switching device is turned off by control circuitry, the first snubber capacitor charges through the first snubber diode to the positive DC voltage to maintain a low voltage across the first switching device which is maintained until the next on pulse when the first switching device and the first recovery switch are turned on by control circuitry. The energy stored in the capacitor is then transferred to the first inductor such that when the energy stored in the first snubber capacitor is about equal to the energy transferred to the first inductor, the first recovery switch is turned off to allow the energy originally stored in the first snubber capacitor to be transferred to the DC supply.

A staggered resonant recovery circuit is provided for returning semiconductor switching device loss energy from a snubber circuit of an AC to DC inverter to a DC voltage supply potential powering the semiconductor switching device. The circuit comprises a DC voltage supply means for supplying a positive DC voltage bus and a negative DC voltage bus relative to the positive DC voltage bus. A first controllable semiconductor recovery switch means has first and second conductor terminals. The first recovery switch has a conductive state and non-conductive state. A second controllable semiconductor recovery switch has first and second conductor terminals. The second recovery switch has a conductive state and non-conductive state. A first recovery diode has a cathode connected to the first terminal of the first recovery switch, and has an anode connected to the negative DC voltage bus. A second recovery diode has an anode connected to the first terminal of the second recovery switch, and has a cathode connected to the positive DC bus. A first recovery inductor has a first end connected to the positive DC bus, and has a second end connected to the first terminal of the first recovery switch. A second recovery inductor has a first end connected to the negative DC bus, and has a second end connected to the first terminal of the second recovery switch. The first recovery switch, the first recovery diode and the first recovery inductor cooperate to form a first recovery circuit to return energy to the DC bus line during a positive half cycle of the AC output of an AC to DC inverter. The second recovery switch, the second recovery diode and the second recovery inductor cooperate to form a second recovery circuit to return energy to the DC bus line during a negative half cycle of the AC output of an AC to DC inverter. An inverter phase circuit is provided to communicate with an inverter power pole, and includes a first snubber capacitor having first and second terminals. The first terminal is connected to the positive DC voltage bus. A first snubber diode includes an anode connected to the second terminal of the first snubber capacitor at a first power pole junction. The first terminal of the first snubber capacitor and the cathode of the first snubber diode are to be respectively connected to terminals of a first controllable power pole switching device. A second snubber capacitor has first and second terminals. The first terminal is connected to the negative DC voltage bus. A second snubber diode includes an anode connected to the second terminal of the second snubber capacitor at a second power pole junction. The first terminal of the second snubber capacitor and the cathode of the second snubber diode are to be respectively connected to terminals of a second controllable power pole switching device. A first connecting diode has a cathode connected to the second terminal of the first recovery switch, and has an anode to be connected to the first power pole junction. A second connecting diode has an anode connected to the second terminal of the second recovery switch, and has a cathode to be connected to the second power pole junction. During a negative half cycle at the output junction, when the second switching device is turned off by the control circuitry with the second snubber capacitor charged, the second snubber diode becomes reverse biased and the second connecting diode is to become forward biased such that the voltage potential at the second power pole junction falls to minus Vdc relative to the negative DC bus and becomes the input to the recovery circuit. The second recovery switch is turned on by the control circuitry to build up a current in the second recovery inductor flowing from the negative DC bus through the second power pole switch, through the second snubber capacitor, through the second connecting diode, through the second recovery switch and the second recovery inductor to return to the negative DC bus. During a positive half cycle at the output junction, the current returns to the positive DC bus in substantially the same way as that during the negative cycle by corresponding components associated with the first power pole.

A system including a staggered resonant recovery circuit is provided for returning semiconductor switching device loss energy from a snubber circuit of an AC to DC inverter to a DC voltage supply potential powering the semiconductor switching device. The system comprises a DC voltage supply means for supplying a positive DC voltage bus and a negative DC voltage bus relative to the positive DC voltage bus. A clock and control circuit is provided for controlling the actuation and timing of the resonant recovery circuit and switching devices of the inverter. A first controllable semiconductor recovery switch means has first and second conductor terminals. The first recovery switch has a conductive state and non-conductive state. A second controllable semiconductor recovery switch has first and second conductor terminals. The second recovery switch has a conductive state and non-conductive state. A first recovery diode has a cathode connected to the first terminal of the first recovery switch, and has an anode connected to the negative DC voltage bus. A second recovery diode has an anode connected to the first terminal of the second recovery switch, and has a cathode connected to the positive DC bus. A first recovery inductor has a first end connected to the positive DC bus, and has a second end connected to the first terminal of the first recovery switch. A second recovery inductor has a first end connected to the negative DC bus, and has a second end connected to the first terminal of the second recovery switch. The first recovery switch, the first recovery diode and the first recovery inductor cooperate to form a first recovery circuit to return energy to the DC bus line during a positive half cycle of the AC output of an AC to DC inverter. The second recovery switch, the second recovery diode and the second recovery inductor cooperate to form a second recovery circuit to return energy to the DC bus line during a negative half cycle of the AC output of an AC to DC inverter. An inverter phase circuit comprises an inverter power pole, each set of power poles includes a first snubber capacitor having first and second terminals. The first terminal is connected to the positive DC voltage bus. A first snubber diode includes an anode connected to the second terminal of the first snubber capacitor at a first power pole junction. The first terminal of the first snubber capacitor and the cathode of the first snubber diode are to be respectively connected to terminals of a first controllable power pole switching device. A second snubber capacitor has first and second terminals. The first terminal is connected to the negative DC voltage bus. A second snubber diode includes an anode connected to the second terminal of the second snubber capacitor at a second power pole junction. The first terminal of the second snubber capacitor and the cathode of the second snubber diode are to be respectively connected to terminals of a second controllable power pole switching device. A first connecting diode has a cathode connected to the second terminal of the first recovery switch, and has an anode to be connected to the first power pole junction. A second connecting diode has an anode connected to the second terminal of the second recovery switch, and has a cathode to be connected to the second power pole junction. During a negative half cycle at the output junction, when the second switching device is turned off by the control circuitry with the second snubber capacitor charged, the second snubber diode becomes reverse biased and the second connecting diode is to become forward biased such that the voltage potential at the second power pole junction falls to minus Vdc relative to the negative DC bus and becomes the input to the recovery circuit. The second recovery switch is turned on by the control circuitry to build up a current in the second recovery inductor flowing from the negative DC bus through the second power pole switch, through the second snubber capacitor, through the second connecting diode, through the second recovery switch and the second recovery inductor to return to the negative DC bus. During a positive half cycle at the output junction, the current returns to the positive DC bus in substantially the same way as that during the negative cycle by corresponding components associated with the first power pole.

Other features and advantages of the present invention will become readily apparent from the following written description and drawings.

BRIEF DESCRIPTION OF THE DRAWINGS

FIG. 2 is a set of waveforms associated with the basic resonant recovery circuit of FIG. 1 wherein:

FIG. 2a shows the clock timing pulses;

FIG. 2b shows the conduction period of one of the bridge switching semiconductor devices of one-half of the H-shaped bridge;

FIG. 2c shows the voltage across the snubber capacitor associated with the bridge switching semiconductor device of FIG. 2b;

FIG. 2d shows the conduction period of the resonant recovery semiconductor switching device used to discharge the snubber capacitor of FIG. 2c;

FIG. 2e shows the voltage of the inductor connected between the resonant recovery semiconductor switching device and the capacitor divider circuit;

FIG. 2f shows the current in the inductor as a result of the discharge of the snubber capacitor;

FIG. 2g shows the discharge voltage waveshape of the snubber capacitor associated with the other bridge switching semiconductor device of the other half of the H-shaped bridge;

FIG. 4 is a set of waveforms associated with the inverter of FIG. 3 wherein:

FIG. 4a is shows the clock timing pulses;

FIG. 4b shows the conduction period of an IGBT of one-half of the first pole of the four pole inverter of FIG. 3;

FIG. 4c shows the voltage across the snubber capacitor associated with the IGBT of FIG. 4b;

FIG. 4d shows the conduction period of the resonant recovery IGBT switching device used to discharge the snubber capacitor of FIG. 4c;

FIG. 4e shows the voltage of the phase A inductor;

FIG. 4f shows the inductor current as a result of the discharge of the snubber capacitor;

FIG. 4g shows the discharge voltage waveshape of the snubber capacitor of the other half of the first pole of the four pole inverter of FIG. 3;

FIG. 4h shows the current through the diode discharging the snubber capacitor of FIG. 4c;

FIG. 4i shows the conduction period of the IGBT of one-half of the second pole of the four pole inverter of FIG. 3;

FIG. 4j shows the voltage across the snubber capacitor associated with the IGBT of FIG. 4i;

DETAILED DESCRIPTION OF PREFERRED EMBODIMENTS

Figure 1:
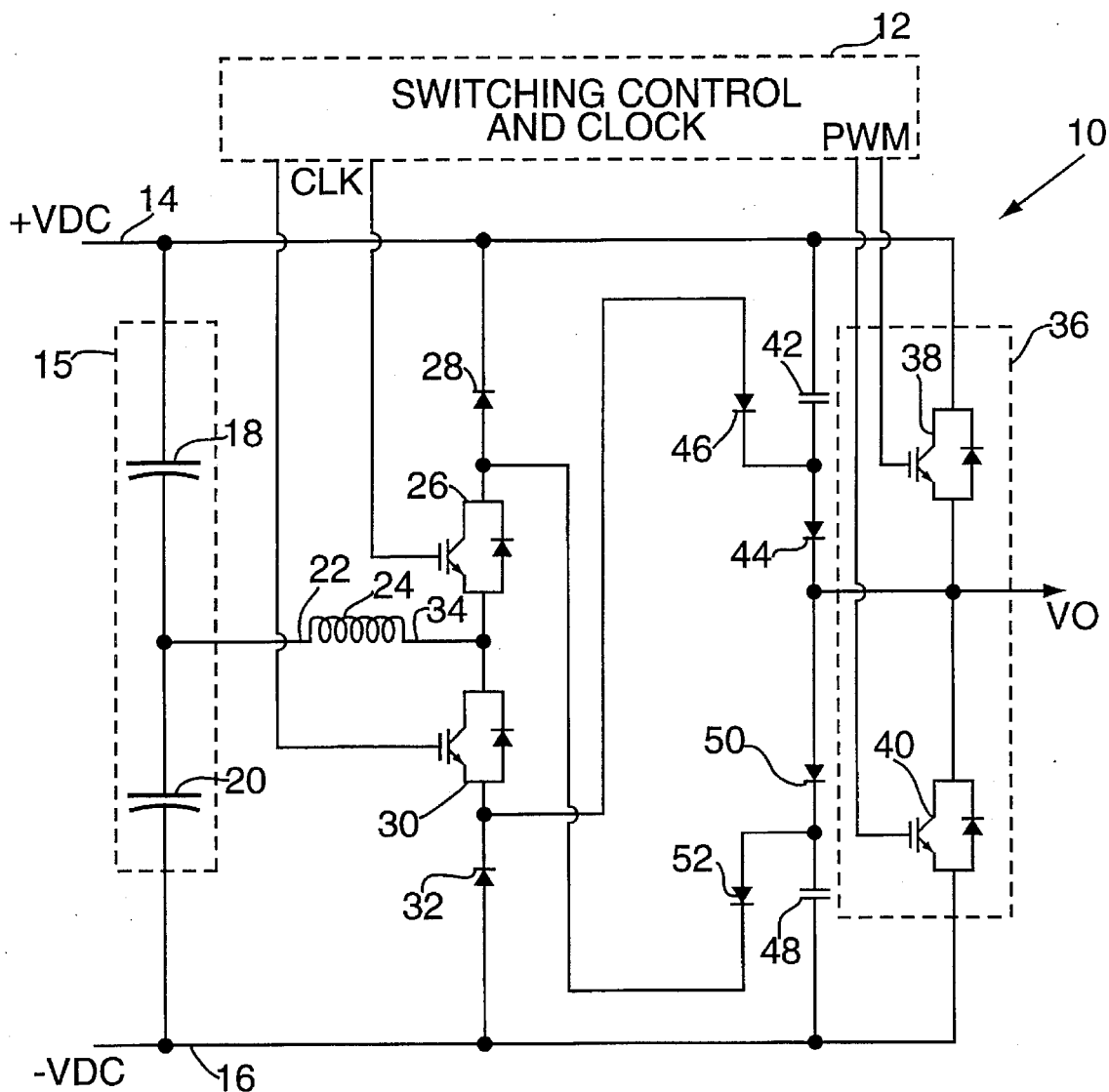
FIG. 1 is an electrical schematic diagram of a basic resonant recovery circuit.

Referring now to the drawings, FIG. 1 is a simplified electrical schematic diagram showing a basic resonant recovery circuit of the prior art which will be useful in understanding the later-explained advantages of the present invention. The circuit is coupled to one-half of an H-shaped bridge which may be considered as one pole of an inverter for purposes of the present explanation and is generally designated 10. The necessary switching control pulse signals and clock timing pulse signals are provided by means Of a switching control and clock circuit as shown by the functional block diagram within the dash line box 12.

The resonant recovery circuit of FIG. 1 utilizes a split DC voltage supply, that is, the circuit is connected between a positive DC voltage potential shown as the bus 14 and a negative DC voltage potential shown as the bus 16. A capacitor divider circuit shown within the dash line box 15 is connected between the positive and negative DC voltage buses 14, 16, respectively and is made up of the series connection of capacitor 18 and capacitor 20. One end 22 of an inductor 24 is connected to the junction of the capacitors 18 and 20 and as explained below the switching loss energy is returned to the capacitors and the DC voltage buses through the inductor 24.

Since the capacitor divider circuit 15 is connected between the positive and negative DC voltage buses 14 and 16, the voltage potential at the junction of the capacitors 18 and 20 is substantially midway between the positive and negative DC voltage magnitudes. The resonant recovery circuit further comprises a first resonant recovery semiconductor switching device shown as a transistor switch 26 having its collector terminal connected to the positive DC voltage bus 14 through a diode 28 such that the anode of the diode is connected to the collector terminal of the transistor switch 26. A second resonant recovery semiconductor switching device shown as a transistor switch 30 has its emitter terminal connected to the negative DC voltage potential bus 16 through a diode 32 with the emitter terminal being connected to the cathode terminal of the diode. The emitter terminal of the recovery transistor switch 26 is connected to the collector terminal of the recovery transistor switch 30 and to one end 34 of the inductor 24. The switching frequency of the resident recovery transistor switches 26,30 is much higher than the frequency of the output voltage at the output $V_O$ of the illustrated one-half H-shaped bridge as represented in the dash line box 36. The half H-bridge is conventionally configured with the emitter of one bridge transistor switch 38 connected to the collector terminal of the second bridge transistor switch 40 with the emitter terminal of the bridge transistor switch 38 and the collector terminal of the bridge transistor switch 40 forming part of the output terminal $V_O$. The bridge transistor switches 38,40 are under control of the switching control and clock circuit 12.

The resonant recovery circuit further includes a capacitor 42 having one end connected to the positive DC voltage bus 14 and its opposite end connected to the output $V_O$ through a diode 44 such that the anode of the diode 44 is connected to the capacitor 42 and to the cathode of a diode 46. The anode of the diode 46 is connected to the junction of the emitter terminal of the recovery transistor switch 30 and the cathode of the diode 32. The anode of the diode 32 is connected to the negative DC voltage bus 16. In a similar pattern, a capacitor 48 is connected to the negative DC voltage bus 16 and has one end connected to the voltage output $V_O$ through a diode 50 such that the capacitor 48 is connected to the cathode of the diode 50 and to the anode of a diode 52 with the cathode of the diode 52. The cathode of the diode 52 is connected to the junction of the collector terminal of the recovery transistor switch 26 and anode of the diode 28. The cathode of diode 28 is connected to the positive DC voltage bus 14.

The operation of the basic resonant recovery circuit of the present invention is as follows and for purposes of explanation is discussed with respect to the negative half cycle of the frequency of the output voltage. With reference to the waveforms of FIG. 2, FIG. 2a shows the clock timing pulses generated by the switching control and clock circuit 12. When the bridge transistor switch 40 is turned-off or made non-conductive as shown in the waveform of FIG. 2b, the snubber capacitor 48 charges through the diode 50 to the voltage potential of the positive voltage DC bus 14 as shown in the waveform of FIG. 2c. The voltage charge on the capacitor 48 is maintained until the next "on" pulse wherein bridge transistor switch 40 is made conductive and at this time the recovery transistor switch 26 is also made conductive as shown in the waveform of FIG. 2d. The positive DC voltage potential appears across the inductor 24 as shown in the waveform of FIG. 2e and the current builds sinusoidally through the diode 52 as shown in the waveform of FIG. 2f, through the recovery transistor switch 26 and the inductor 24. The voltage across the snubber capacitor 42 decays through zero and resonates toward the negative DC voltage potential of the bus 16 as illustrated in the waveform of FIG. 2g. As the voltage of the snubber capacitor 42 resonates towards the negative DC voltage potential, the current through the diode 52 becomes insufficient to maintain conduction and the diode becomes non-conductive with the consequence of the voltage appearing across the inductor 24 falling to zero. The bridge transistor switch 40 remains conductive under control of the switching control and clock circuit 12 and typically such control is means of a pulse width modulator. The control is such that the bridge transistor switch 40 continues to conduct to provide the necessary voltage at the output $V_O$ at the output voltage frequency. The operation of the resonant recovery circuit of the present invention with respect to the positive half cycle of the output voltage frequency should be apparent from the above description.

Figure 3:
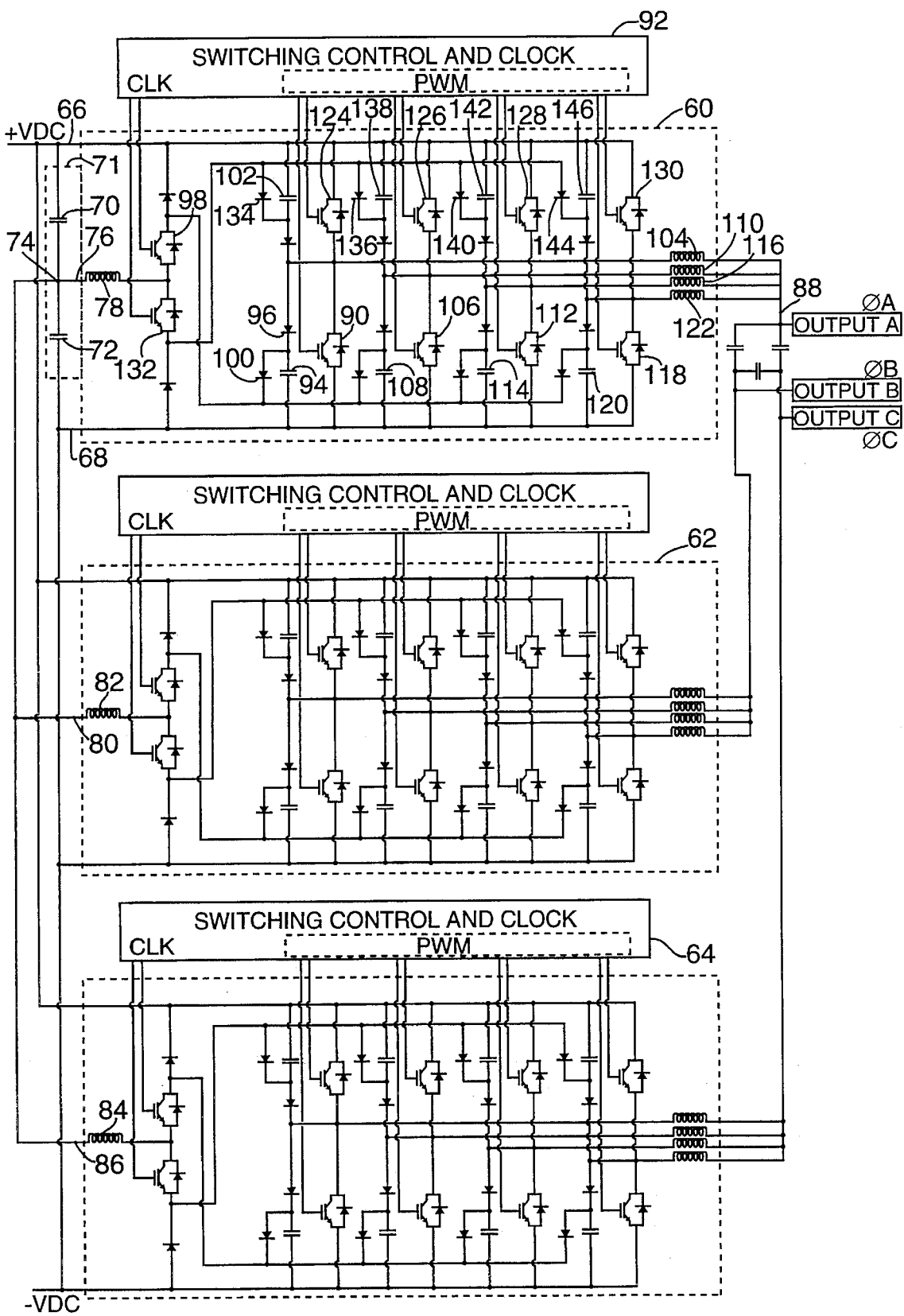
FIG. 3 is an electrical circuit schematic diagram of a three phase inverter utilizing a staggered resonant recovery circuit of the present invention in the inverter for each phase with each phase inverter inductor discharging energy to one capacitor divider circuit across the split DC voltage supply.

Turning now to FIG. 3, the basic resonant recovery circuit of the present invention is illustrated embodied as a staggered resonant recovery circuit in an inverter as a four staggered pole configuration with each pole's respective operation displaced by one quarter clock pulse cycle. The similarity of the single half H-bridge of FIG. 1 is readily apparent for one pole. In the electrical circuit schematic diagram of FIG. 3, the resonant recovery switching devices are insulated gate bipolar transistors (IGBT), and for purposes of the present explanation, the clock frequency is presumed to be a 30 kilohertz square wave and is shown in the representative waveform of FIG. 4a. It is further taken that the frequency of the voltage output is 60 hertz. The electrical circuit schematic diagram implementation illustrated in FIG. 3 is shown for a three-phase inverter with phase A developed by the inverter shown in the dash line box 60, phase B developed by the inverter shown in dash line box 62 and phase C developed by the inverter shown in dash line box 64. Each of the inverter circuits for phase A, B and C respectively operate similarly and a detailed explanation will only be given for phase A illustrated in the dash line box 60, it being understood that the operation of the inverters for phases B and C shown in dash line box 62 and 64 respectively is substantially identical.

As illustrated in FIG. 3, a split DC voltage supply is used to power the respective inverters with the positive DC voltage potential on bus 66 and the negative DC voltage potential appearing on bus 68. The positive and negative DC voltage potentials are applied as shown to each of the inverter circuits. A single capacitor divider circuit shown in the dash line box 71 is connected between the positive and negative DC voltages appearing on buses 66,68 respectively and comprise series capacitor 70 having one end connected to the positive DC voltage bus 66 and series capacitor 72 having one end connected to the negative DC voltage bus 68. The junction 74 of the series capacitors 70 and 72 is connected to one end 76 of an inductor 78 associated with the phase A inverter shown in the dash line box 60, to one end 80 of inductor 82 associated with the phase B inverter shown in the dash line box 62 and to one end 84 of an inductor 86 associated with phase C inverter shown in the dash line box 64. The respective inductors 78, 82 and 86 return switching loss energy to the capacitors 70 and 72, respectively for return to the DC voltage supply.

Figure 4:
Figure 4:
Figure 4:
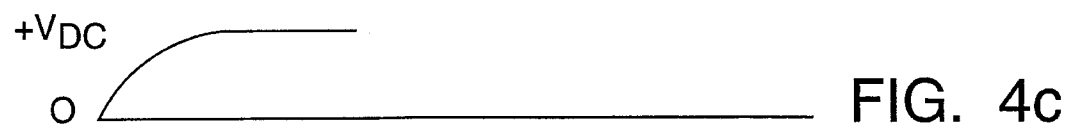
Figure 4:
Figure 4:
Figure 4:
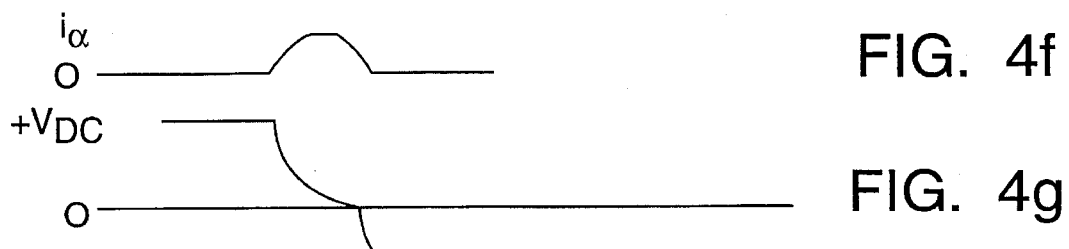
Figure 4:
Figure 4:
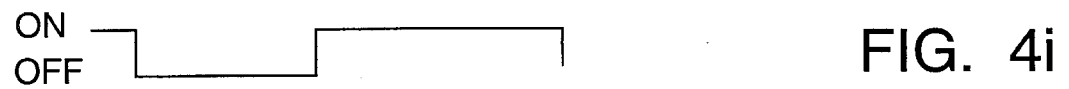
Figure 4:

The operation of the staggered resonant recover circuit with the staggered four pole inverter shown in the dash line box 60 is explained, as in connection with FIG. 1, with respect to the negative half cycle of the output voltage at the output of phase A shown as reference numeral 88. When the IGBT 90 under control of the switching control and clock circuit shown in the block diagram 92 is made non-conductive and turns-off as shown in the waveform of FIG. 4b, the snubber capacitor 94 charges as shown in the waveform of FIG. 4c through the diode 96 to the voltage of the positive DC voltage bus 66. The voltage charge is maintained across the capacitor 94 until the next "on" pulse wherein the IGBT device 90 and the resonant recovery IGBT 98 are turned "on" and become conductive as shown in the waveforms of FIGS. 4b and 4d, respectively. Since the inductor 78 is tied to the junction 74 of the capacitor divider 71 and substantially to the midpoint of the DC voltage supply, one-half the magnitude of the supply voltage will appear across the inductor 78 as shown in the waveform of FIG. 4e. The current will build sinusoidally as shown in the waveform of FIG. 4f through the diode 100, through the staggered resonant recovery IGBT 98 and the inductor 78. The voltage across the snubber capacitor 102 will discharge and fall through zero and resonant toward the negative DC voltage appearing on the negative DC voltage bus 68 as shown in the waveform Of FIG. 4g. The current through the diode 100 will become insufficient to maintain conduction and the diode will turn-off as shown in the waveform of FIG. 4h with the result that the voltage across the inductor 78 will fall to zero as shown in the waveform of FIG. 4e. The IGBT 90 will continue to conduct as required through the control of the switching control and clock circuit 92 as necessary to develop the required voltage at the 60 hertz output frequency. The output of the IGBT 90 is coupled to the output 88 through a filter inductor 104 to filter high frequency components. One quarter clock cycle after the IGBT 90 turns-off, the IGBT 106 turns-off as illustrated in the waveform of FIG. 4i with the result that another pulse of current flows through the resonant recovery IGBT 98, through the inductor 78 into the junction 74 of the capacitor divider circuit 71 from the discharge of the voltage across the snubber capacitor 108 as shown in the waveform of FIG. 4j. The output of the IGBT 106 is connected to the output 88 through the filter inductor 110 to filter high frequency components. Likewise, in a similar manner, the IGBT 112 turns-off one quarter clock cycle after the IGBT 106 causing the snubber capacitor 114 to discharge with the result of an additional pulse of current flowing through the resonant recovery IGBT 98 and the inductor 78 to the junction 74 of the capacitor divider circuit 71. The output of the IGBT 112 is connected to the output voltage 88 through the filter inductor 116. Likewise, the IGBT 118 causes the snubber capacitor 120 to discharge through the resonant recovery IGBT 98 to deliver another pulse of current through the inductor 78 to the junction 74 of the capacitor divider circuit 71. The output of the IGBT 118 is coupled to the output 88 through the filter inductor 122 and as in the case of the other IGBT's 90, 106 and 112, IGBT 118 also conducts as necessary to develop the appropriate desired voltage at the output frequency.

During the next half cycle of the output voltage frequency that is, the positive half cycle, the IGBT switches 124, 126, 128 and 130 form the inverter and operate in a similar manner as described for the discharge of capacitors 94, 108, 114 and 120. The resonant recovery IGBT 132 and diode 134 discharge capacitor 102 into the capacitor divider circuit 71 through the inductor 78. Likewise at the appropriate timing, capacitor 138 is discharged through the diode 136; capacitor 142 is discharged through the diode 140 and capacitor 146 is discharged through the diode 144.

In the illustrated embodiment of FIG. 3, one inductor is used with four poles of each inverter thus reducing and minimizing the overall size of the inverter. In addition, the instantaneous voltages of phase A, phase B and phase C are such that the sum of the voltages is equal to zero and the average voltage applied through the inductors 78, 82 and 86 is equal to zero which maintains the voltage at the junction 74 of the capacitors 70, 72 forming the capacitor divider circuit 71 at the midpoint of the split DC voltage supply.

Figure 5:
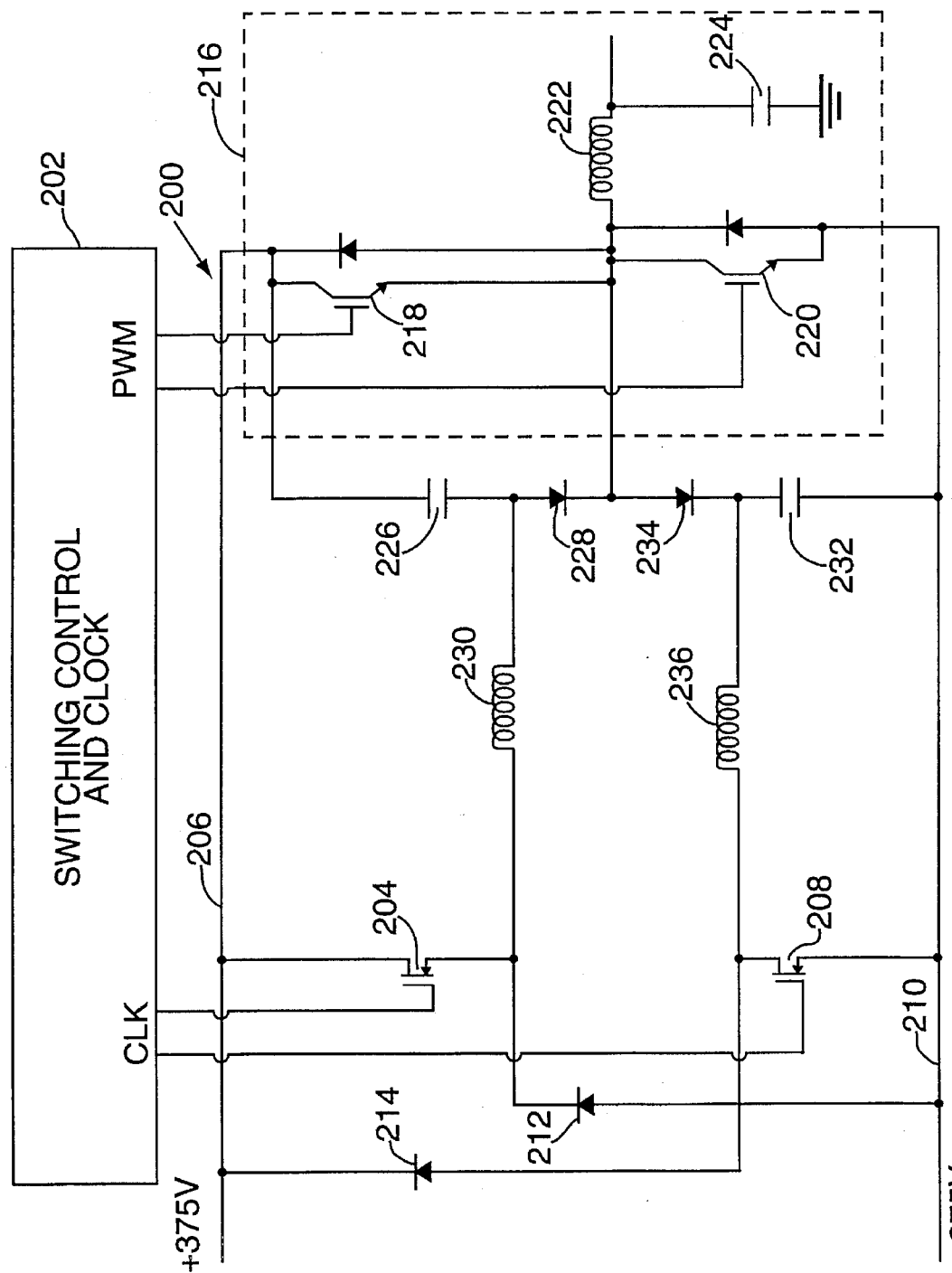
FIG. 5 shows a flyback resonant recovery circuit provided in accordance with the present invention.

FIG. 5 shows a flyback form of the resonant recovery circuit for an inverter circuit designated generally at 200 which does not require a split DC supply. The switching frequency would be much higher than the output frequency. The inverter 200 as shown could be one pole of a three phase system or half of an "H" bridge. The necessary switching control pulse signals and clock timing pulse signals are provided by means of a switching control and clock circuit as shown by the functional block diagram within the box 202.

The inverter circuit 200 further comprises a first resonant recovery semiconductor switching device shown as an FET recovery switch 204 having its drain terminal connected to a positive DC voltage bus 206 set at +375 volts DC. A second resonant recovery semiconductor switching device shown as an FET recovery switch 208 has its source terminal connected to a negative DC voltage potential bus 210 set at −375 volts DC. A recovery diode 212 connects the source of the switch 204 to the negative bus. More specifically, the diode 212 includes an anode connected to the negative bus, and includes a cathode connected to the source of the switch 204. Furthermore, a recovery diode 214 connects the drain of the switch 208 to the positive bus. More specifically, the diode 214 includes a cathode connected to the positive bus, and includes an anode connected to the drain of the switch 208.

The switching frequency of the resident recovery transistor switches 204, 208 is much higher than the frequency of the output voltage at the output $V_o$ of the illustrated one-half H-shaped bridge as represented in the dash line box 216. The half H-bridge is configured with the emitter of one bridge transistor switch 218 connected to the collector terminal of the second bridge transistor switch 220 with the emitter terminal of the bridge transistor switch 218 and the collector terminal of the bridge transistor switch 220 connected to the output terminal $V_o$ via the output filter comprising inductor 222 and capacitor 224. The bridge transistor switches 218, 220 are under control of the switching control and clock circuit 202.

In the resonant recovery circuit of FIG. 5 there is a snubber capacitor 226 having one end connected to the positive DC voltage bus 206 and its opposite end connected to the output filter through the cathode of snubber diode 228 such that the anode of the diode 228 is connected to the capacitor 226 and to one end of a recovery inductor 230. The other end of the inductor 230 is connected to the source of the switch 204.

The resonant recovery circuit of the present invention has a snubber capacitor 232 having one end connected to the negative DC voltage bus 210 and its opposite end connected to the output filter through the anode of snubber diode 234 such that the cathode of the diode 234 is connected to the capacitor 232 and to one end of a recovery inductor 236. The other end of the inductor 236 is connected to the drain of the switch 208.

The energy recovery circuit comprises an upper portion which returns energy to the DC bus line during the positive half cycle of the AC output of the inverter circuit, and a corresponding lower portion which returns energy to the DC bus line during the negative half cycle of the AC output of the inverter. Specifically, the upper recovery circuit comprises upper recovery inductor 230, upper recovery switch 204 and upper recovery diode 212 which cooperate to return energy to the DC bus line from the upper snubber capacitor 226 and the upper snubber diode 228. Correspondingly, the lower recovery circuit comprises lower recovery inductor 236, lower recovery switch 208 and lower recovery diode 214 which cooperate to return energy to the DC bus line from the lower snubber capacitor 232 and the lower snubber diode 234.

The operation of the flyback resonant recovery circuit of the present invention is as follows and for purposes of explanation is discussed with respect to the negative half cycle of the frequency of the output voltage. When the switch 220 is turned off by the switching control and clock circuit 202, the lower snubber capacitor 232 charges through the lower snubber diode 234 to the positive supply voltage so as to maintain a lower voltage across the switch 220 during its turn-off period, and thereby reducing its turn-off losses. The charge on the lower snubber capacitor 232 is maintained until the next on pulse when the switch 220 and the recovery switch 208 are turned on by the switching control and clock circuit 202. The positive DC supply voltage appears across the lower recovery inductor 236, and the current builds sinusoidally through the lower snubber capacitor 232, the lower recovery switch 208 and the lower recovery inductor 236, and the capacitor voltage across the lower snubber capacitor 232 decays. As the capacitor voltage falls and the current in the lower recovery inductor 236 rises, the energy stored in the lower snubber capacitor 232 is transferred to the lower recovery inductor 236.

Ideally, when the electrical energy stored in the lower snubber capacitor 232 and the magnetic energy stored in the lower recovery inductor 236 are equal, the lower recovery switch 208 is turned off by the switching control and clock circuit 202. Thereafter, the voltage across the lower snubber capacitor 232 drops, and the current flowing through the lower recovery inductor 236 from the lower snubber diode 234 to the positive supply bus also drops. Thus, all the energy trapped in the lower snubber capacitor 232 can be transferred to the DC supply. In practice, however, part of the trapped energy appears as component losses which must be dissipated. During the positive half cycle of the AC output of the inverter, energy is recovered in the same manner as just explained during the lower half cycle except that the corresponding lower components of the recovery circuit returns energy from the lower snubber diode and capacitor.

Figure 6:
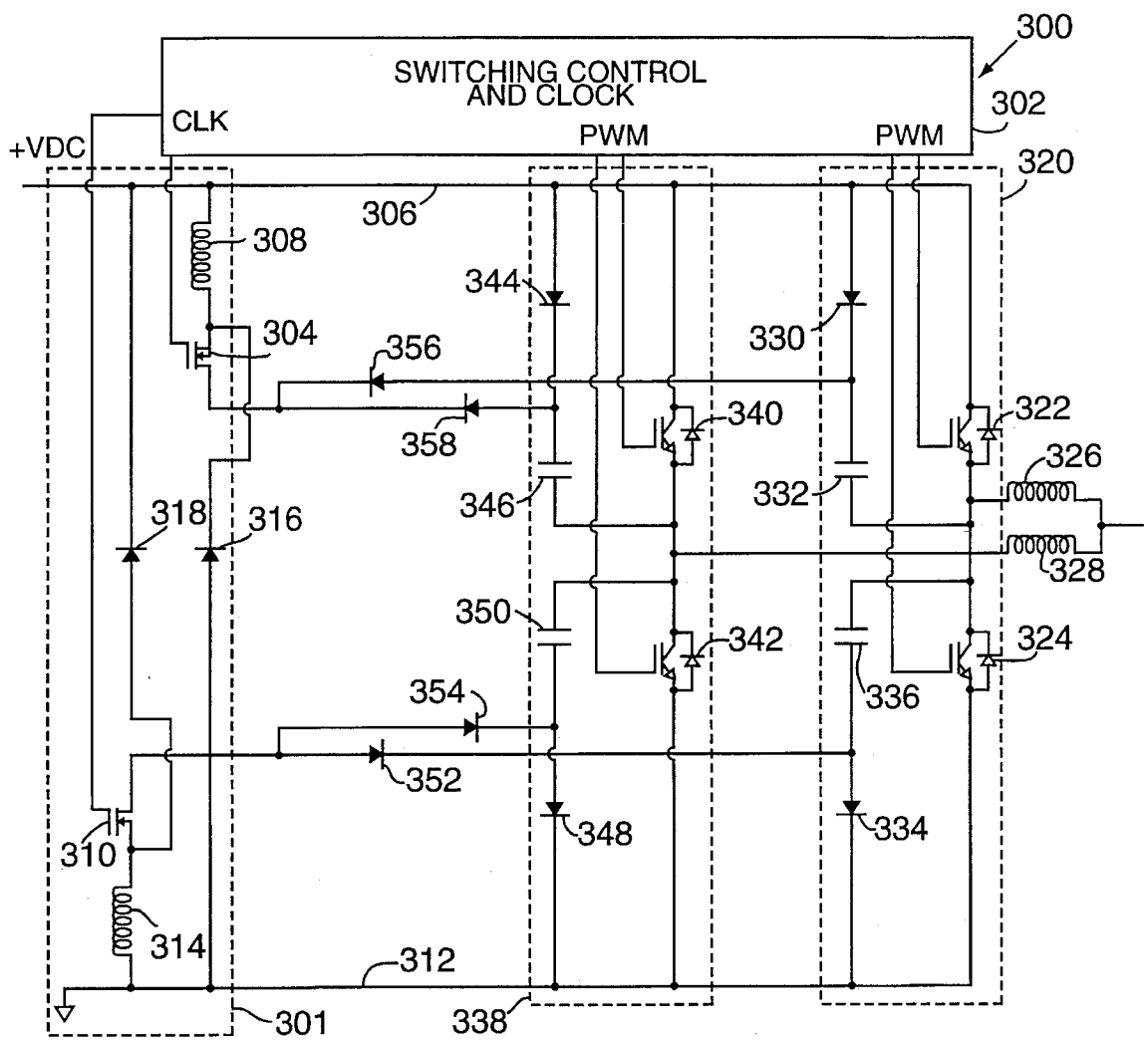
FIG. 6 shows a preferred embodiment of a staggered resonant recovery circuit in accordance with the present invention.

Another embodiment of the present invention is shown in FIG. 6. The recovery circuit does not require a split DC supply and is incorporated into an inverter circuit generally designated by the reference numeral 300. The recovery circuit has the advantage that the regeneration or energy recovery portion of the circuit requires only two sets of active recovery switches and recovery inductors, regardless of how many power poles are being snubbed and regardless of the relative timing or duty cycle of those poles. The energy recovery circuit is enclosed in the shaded box designated as 301. For purposes of illustration, the inverter circuit 300 comprises two power poles. The necessary switching control pulse signals and clock timing pulse signals are provided by means of a switching control and clock circuit as shown by the functional block diagram within the dash line box 302.

The resonant recovery circuit 301 further comprises a first resonant recovery semiconductor switching device shown as an FET recovery switch 304 having its drain terminal connected to a positive DC voltage bus 306 via a recovery inductor 308. A second resonant recovery semiconductor switching device shown as an FET recovery switch 310 has its source terminal connected to ground bus 312 via the recovery inductor 314. A diode connects the source of the recovery switch 304 to the negative bus. More specifically, the recovery diode 316 includes an anode connected to the ground bus, and includes a cathode connected to the source of the recovery switch 304. Furthermore, a recovery diode 318 connects the drain of the recovery switch 310 to the positive bus. More specifically, the recovery diode 318 includes a cathode connected to the positive bus, and includes an anode connected to the drain of the recovery switch 310.

The recovery circuit 301 includes upper and lower recovery circuits. The lower recovery circuit includes lower recovery switch 310, lower recovery inductor 314 and lower recovery diode 318 which cooperate to form a boost converter with its inductor connected to the negative DC bus. The lower recovery circuit returns energy to the DC bus line during the lower half cycle of AC output of the inverter circuit 300. The upper recovery circuit includes upper recovery switch 304, upper recovery inductor 308 and upper recovery diode 316 which cooperate to form a boost circuit with the inductor 308 connected to the positive DC bus. The upper recovery circuit returns energy to the DC bus line during the upper half cycle of the AC output of the inverter.

The switching frequency of the resonant recovery transistor switches 304, 310 is much higher than the frequency of the output voltage at the output $V_O$. The resonant recovery circuit returns energy from a first power pole of the inverter designated by the shaded box 320. The power pole is conventionally configured with the emitter of one IGBT or bridge transistor switch 322 connected to the collector terminal of a second IGBT or bridge transistor switch 324 with the emitter terminal of the bridge transistor switch 322 and the collector terminal of the bridge transistor switch 324 connected to the output terminal $V_O$ via an output filter inductor 326. The bridge transistor switches 322 and 324 are under control of the switching control and clock circuit 302.

The resonant recovery circuit of the present invention further includes a diode 330 having an anode connected to the positive DC voltage bus 306 and a cathode connected to inductor 326 via a capacitor 332. The diode 330 and the capacitor 332 acts as a snubber for the switch 322. The circuit also includes a diode 334 having a cathode connected to the ground bus 312 and an anode connected to the output filter via a capacitor 336. The diode 334 and the capacitor 336 act as a snubber for the switch 324.

The inverter circuit further includes a second power pole designated by the shaded box 338. The power pole is configured with the emitter of one IGBT or bridge transistor switch 340 connected to the collector terminal of a second IGBT or bridge transistor switch 342 with the emitter terminal of the bridge transistor switch 340 and the collector terminal of the bridge transistor switch 342 connected to the output terminal $V_0$ via the output filter inductor 328. The bridge transistor switches 340, 342 are under control of the switching control and clock circuit 302.

The resonant recovery circuit of the present invention further includes a diode 344 having an anode connected to the positive DC voltage bus 306 and a cathode connected to inductor 328 via a capacitor 346. The diode 344 and the capacitor 346 acts as a snubber for the switch 340. The circuit also includes a diode 348 having a cathode connected to the ground bus 312 and an anode connected to inductor 328 via a capacitor 350. The diode 348 and the capacitor 350 acts as a snubber for the switch 342.

The energy recovery portion 301 of the inverter circuit 300 is connected to the first power pole 320 and the second power pole 338 by means of connecting diodes. Specifically, with respect to the lower portion of the recovery circuit, the anode of a connecting diode 352 is connected to the source of the lower recovery switch 310 of the recovery portion, and the cathode is connected to the anode of the lower snubber diode 334 of the first power pole. The anode of a connecting diode 354 is also connected to the source of the lower recovery switch 310 of the recovery portion, and the cathode is connected to the anode of the lower snubber diode 348 of the second power pole.

In the upper portion of the recovery circuit, the cathode of a connecting diode 356 is connected to the drain of the upper recovery switch 304 of the recovery portion, and the anode is connected to the cathode of the upper snubber diode 330 of the first power pole. The cathode of a connecting diode 358 is also connected to the drain of the upper recovery switch 304 of the recovery portion, and the anode is connected to the cathode of the upper snubber diode 344 of the second power pole.

The lower recovery circuit defined by the lower recovery switch 310, the lower recovery inductor 314 and the lower recovery diode 318 returns energy to the DC bus line from the first and second power poles during the negative half cycle of the AC output of the inverter circuit 300. More specifically, energy is returned from the respective lower snubber capacitors 336 and 350 of the first and second power poles of the inverter. Similarly, the upper recovery circuit defined by the upper recovery switch 304, the upper recovery inductor 308 and the upper recovery diode 316 returns energy from the first and second power poles during the positive half cycle of the AC output of the inverter circuit. More specifically, energy is returned from the respective upper snubber capacitors 332 and 346 of the first and second power poles. The connecting diodes 352 and 354 connect the lower snubbers to the lower recovery circuit, and the diodes 356 and 358 connect the upper snubbers to the upper recovery circuit.

When any of the power pole IGBTs 322, 324, 340 or 342 is turned off by the switching control and clock 302, its respective snubber capacitor 332, 336, 346 or 350 charges to the full DC bus voltage through the associated snubber diode 330, 334, 344 or 348. By diverting the IGBT current into the snubber capacitor during turn-off, the voltage across the IGBT rises slowly and the turn off energy loss is greatly reduced. The purpose of the recovery circuit is to return the energy in the snubber capacitor to the DC bus.

Operation of the recovery circuit will now be described during the negative half cycle of the AC output of the inverter circuit. Referring to the first power pole 320, the switching and control circuit 302 turns on the lower power pole IGBT switch 324. When an IGBT such as 324 turns on with the associated lower snubber capacitor 336 charged, the IGBT 324 forces the lower snubber diode 334 of the first power pole to become reverse biased and the lower connecting diode 352 associated with the first power pole to become forward biased. The voltage on the diode side of the snubber capacitor 336 falls to minus V DC relative to the negative DC bus. The voltage on the lower snubber capacitor 336 therefore becomes the input to the recovery circuit. When the lower recovery switch 310 is turned on, the switch builds up a current in the lower recovery inductor 314 which flows from the negative DC bus through the IGBT 324, through the lower snubber capacitor 336, through the connecting lower diode 352, through the lower recovery switch 310 and the lower recovery inductor 314 to return to the negative DC bus. This discharges the lower snubber capacitor 336. When the energy in the lower snubber capacitor 336 is zero, either the lower recovery switch 310 is turned off by the switching and control clock circuit 302 or the lower connecting diode 352 becomes reverse biased, and the current is transferred through the lower recovery diode 318 to the positive DC bus. This discharges the energy stored in the lower recovery inductor 314 which flows from the negative DC bus through the lower recovery inductor 314, through the lower recovery diode 318, and to the main DC bus capacitor (not shown) which is charged to store the recovered energy.

The recovery circuit is then ready for the lower IGBT power pole switch 342 of the second power pole 338 to turn be turned on by the switching control and clock circuit 302, connecting the lower snubber capacitor 350 of the second power pole through the lower connecting diode 354 to the lower recovery circuit. Energy is recovered from the lower portion of the second power pole in the same way as explained above for the lower portion of the first power pole 320. The upper snubbers act in the symmetric fashion with voltages changing in the opposite direction relative to the positive DC bus.

If the lower recovery switch 310 is turned off by the switching control and clock circuit 302 exactly when the voltage across the lower snubber capacitor 336 is zero, and does not turn on again until the current flowing through the lower recovery inductor 314 is zero, then the energy transfer occurs in one cycle of the lower recovery switch 310. Alternatively, the lower recovery switch 310 may be operated at a substantially higher frequency with respect to the main inverter, effectively forming a constant current for discharging the lower snubber capacitors 336 and 350 of respective first and second power poles.

The lower connecting diodes 352 or 354 will become reverse biased as soon as the associated snubber capacitors 336 or 350 is discharged so that no synchronization between the switch 310 and the IGBTs is needed. This allows each upper and lower recovery circuit to handle any number of power poles, even if the power poles are producing different phases of AC output. For instance, an inverter with three output phases and four power poles per phase would require only a single set of upper and lower recovery circuits.

If the values of the recovery inductors 314, 308 and the switching frequency, Fr, of the FETs are chosen such that VDC is much less than the multiplied product of: $L*Fr*2*\pi*$ (the discharge current), then the operation is continuous, and the duty cycle of the FETs (fraction of the time they are turned on) is optimally set to the fraction $\pi/(1+\pi)$. The discharge current is equal to the snubber capacitance times the DC voltage VDC times the number of power poles times the main IGBT pulse width modulation frequency (Fpwm). The peak current in the regeneration inductor is optimally twice the discharge current (Id), if the inductor value L is equal to V DC/(2*Id*Fr*(1+π)). This produces a condition in which the inductor current just reaches zero on each cycle, and minimizes the energy stored in the recovery inductor.

The sizing of the snubber capacitors is determined by the turn-off characteristics of the main power pole switches. These have been described here as insulated-gate bipolar transistors (IGBTs), but could also be bipolar transistors, metal oxide silicon field-effect transistors (MOSFETs), silicon-controlled rectifiers (GTO SCRs), MCTs, or any other power switch device or assembly with turn-off capability.

As was explained above, an advantage of the resonant recovery circuit of FIG. 6 is that the energy recovery portion shown generally at 301 in FIG. 6 can handle different phases of AC output. For instance, an inverter with three output phases and four power poles per phase would require only a single set of upper and lower regeneration circuits.

Figure 7:
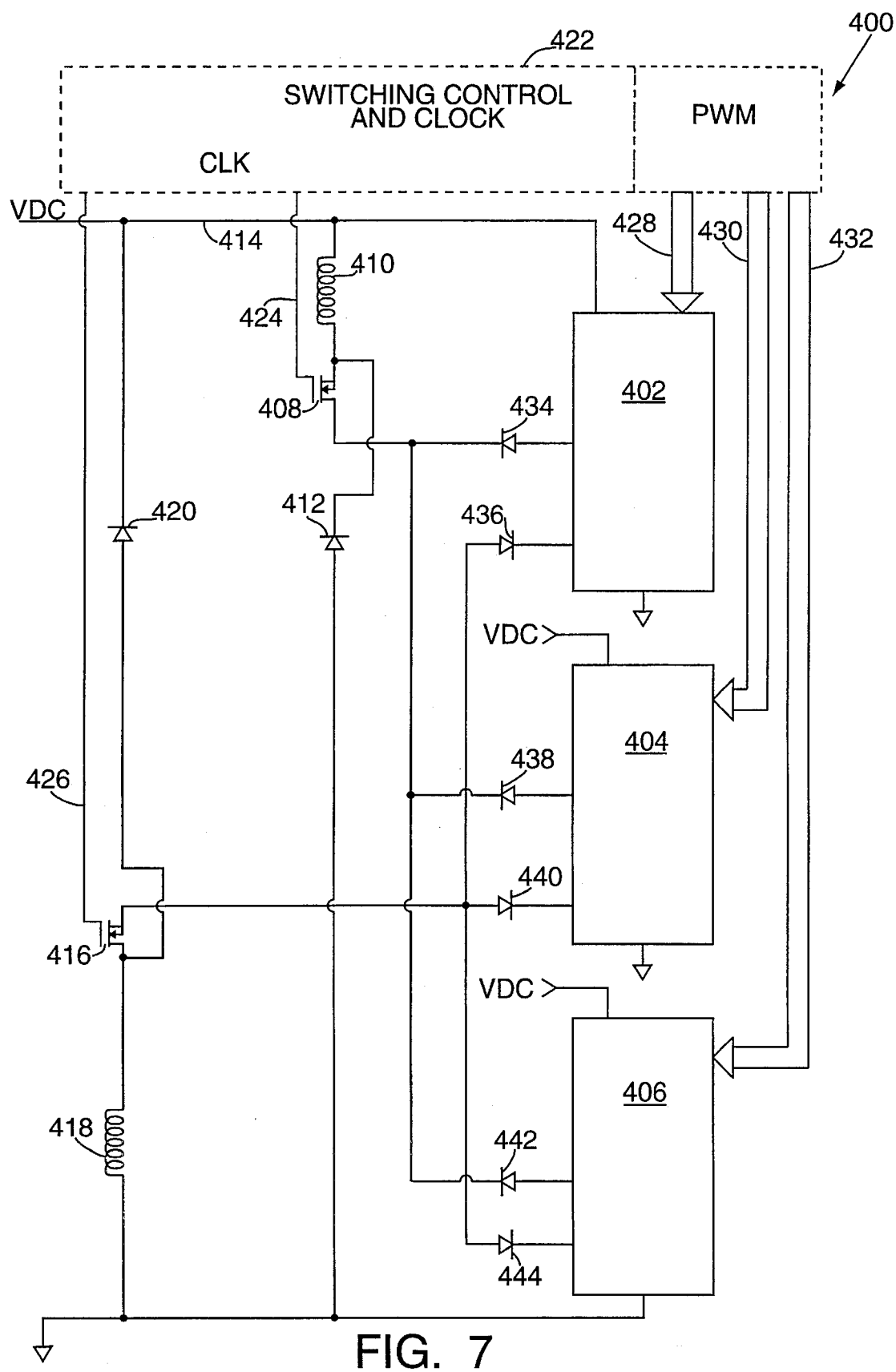
FIG. 7 schematically shows the preferred embodiment of the staggered resonant recovery circuit of FIG. 6 expanded to three-phase application.

For example, FIG. 7 schematically illustrates utilizing the upper and lower recovery circuits of FIG. 6 in a three-phase inverter generally referenced at 400. Each phase of the inverter comprises a single power pole for purposes of simplified illustration. However, each phase of the inverter circuit need not be limited to a single power pole.

Schematic blocks 402, 404 and 406 respectively represent power poles of first, second, and third phase AC outputs of the inverter circuit 400. Each of the power poles represented by blocks 402, 404 and 406 is similar to the power pole contained within the box 320 shown in FIG. 6.

An upper recovery circuit comprising an upper recovery FET switch 408, an upper recovery inductor 410 and an upper recovery diode 412 cooperate to return energy to the DC bus line 414 during the positive half cycles of the AC outputs (not shown) of the respective power poles 402, 404 and 406.

Similarly, a lower recovery circuit comprising a lower recovery FET switch 416, a lower recovery inductor 418 and a lower recovery diode 420 cooperate to return energy to the DC bus line 414 during the negative half cycles of the AC outputs (not shown) of the respective power poles 402, 404 and 406.

A switching control and clock circuit 422 controls the timing of the upper and lower recovery switches 408 and 416 via respective clock lines 424 and 426. Furthermore, the clock circuit controls the turning on and off of the power poles 402, 404 and 406 by the respective PWM control lines 428, 430 and 432. Upper and lower connecting diodes 434 and 436 connect the first phase power pole 402 to respective upper and lower recovery circuits. The connecting diodes are internally connected to the power pole 402 in a similar manner as the upper and lower connecting diodes 358 and 352 are connected to the first power pole 320 of FIG. 6. Similarly, the upper and lower connecting diodes 438 and 440 are connected to the second phase power pole 404, and the upper and lower connecting diodes 442 and 444 are connected to the third phase power pole 406.

As was explained above with respect to FIG. 6, because the connecting diodes become reverse biased as soon as the associated snubber capacitors in each power pole is discharged, no synchronization between the power poles and the recovery switches 408 and 416 is necessary. Therefore, only a single set of upper and lower recovery circuits is required regardless of the number of power poles and regardless of the number of phases within the inverter circuit. Therefore the recovery circuit of FIGS. 6 and 7 considerably reduces the expense, size and number of components required in multi-phase and multi-power pole inverters.

A resonant recovery circuit has been described above and particularly as used in a three phase DC-to-AC power inverter with multiple staggered poles. It will be recognized by those skilled in the art that the resonant recovery circuit of the present invention has numerous applications and therefore the invention has been described by way of illustration rather than limitation.

I claim:

1. A resonant recovery circuit for returning semiconductor switching device loss energy from a snubber circuit of a DC to AC inverter to a DC voltage supply potential powering the semiconductor switching device, said recovery circuit comprising:

a recovery circuit per phase signal output of a DC to AC inverter including:

a first controllable semiconductor recovery switch means having a conductive state and non-conductive state;

a second controllable semiconductor recovery switch means having a conductive state and non-conductive state;

a split DC voltage supply means for supplying a positive DC voltage bus and a negative DC voltage bus relative to the positive DC voltage bus;

said first and second recovery switch means being connected in a series circuit arrangement between said positive and negative DC voltage buses, respectively and defining a junction at the connection between said first and second recovery switches;

a capacitor divider circuit means connected between said positive and negative DC voltage buses, respectively, said capacitor divider circuit means further comprising a first and second capacitor in a series circuit arrangement and defining a junction at the connection between said first and second capacitor;

a recovery inductor connected between said recovery switches junction and said capacitors junction;

first and second sets of diode means where each set of diode means is configured to return energy to the DC bus line from a power pole of a DC to AC inverter, the actuation of the power poles being staggered from one another to efficiently recover energy generated by switching losses within each power pole;

each set of diode means per power pole comprising a first recovery diode means coupled between a first snubber capacitor of a first snubber circuit associated with a first semiconductor power pole switching device and said first recovery switch means for discharging said first snubber capacitor through said recovery inductor when said first recovery switch means is made conductive by switch control circuitry which is timed so that a first pulse of current is delivered to the junction of said first and second switching capacitors to be returned to the DC voltage buses during a positive half cycle of the AC output of the inverter;

a second recovery diode means coupled between a second snubber capacitor of a second snubber circuit associated with a second semiconductor power pole switching device and said second recovery switch means for discharging said second snubber capacitor through said recovery inductor when said second recovery switch means is made conductive by switch control circuitry which is timed so that a second pulse of current is delivered to the junction of said first and second capacitors to be returned to the DC voltage buses during a negative half cycle of the AC output of the inverter, said first recovery switch means being conductive when said secondary recovery switch means is non-conductive and said first recovery switch means being non-conductive when said second recovery switch means is conductive.

2. A resonant recovery circuit as defined in claim 1 wherein said first and second switching devices form one pole of an H-shaped bridge and have controllable conduction periods to generate a desired output voltage at a predetermined frequency.

3. A resonant recovery circuit for use in a multi-phase DC-to-AC high power inverter of the type having "M" phase inverters wherein each of said "M" phase inverters has "N" poles each of which poles include at least one controllable power semiconductor switching device and an associated snubber circuit for storing switching loss energy of the semiconductor switching device, said recovery circuit comprising:

a first controllable semiconductor recovery switch means having a conductive state and non-conductive state;

a second controllable semiconductor recovery switch means having a conductive state and non-conductive state;

diode means connected one-for-one with a respective snubber circuit associated with said controllable semiconductor switching device of each of the "N" poles of one phase inverter of the "M" phase inverters, said diode means being connected to said first and second recovery switch means such that a snubber capacitor discharges through its associated diode when one of said first and second recovery switch means is made conductive at the same time that a controllable semiconductor switching device of the corresponding pole of said "N" poles is made conductive, said first recovery switch means being operable to discharge a snubber capacitor of a snubber circuit corresponding to the controllable semiconductor switching device conducting a positive polarity voltage to the output of the inverter and the second recovery switch means being operable to discharge a snubber capacitor of a snubber circuit corresponding to the controllable semiconductor switching device conducting a negative polarity voltage to the inverter output;

a split DC voltage supply means for supplying a DC voltage potential to a positive DC voltage bus and a negative DC voltage bus, respectively;

a capacitor divide circuit means connected between said positive and negative DC voltage buses, respectively, said capacitor divider circuit means further comprising a first and second capacitor in a series circuit arrangement and defining a junction at the connection between said first and second capacitor;

a first inductor coupled to said first and second recovery switches and to said capacitor divider circuit for delivering a pulse of current to said capacitor divider circuit each time one of said snubber capacitors is discharged.

4. A resonant recovery circuit as defined in claim 3 wherein said controllable semiconductor switching devices associated with each of said "N" poles is made conductive sequentially during a conduction period of said first and second recovery switch means.

5. A three phase DC-to-AC power inverter having a resonant recovery circuit comprising:

three DC-to-AC power inverters each producing an output AC voltage phase shifted equally from one another, each of said inverters comprising:

a split DC voltage supply means for supplying a positive DC voltage bus and a negative DC voltage bus;

"N" inverter poles comprising a first and second controllable semiconductor switching devices connected in series between said positive and negative DC voltage buses, said first and second controllable semiconductor switching devices having a common output connection defining a voltage output;

snubber circuit means associated one-for-one with each of said first and second controllable semiconductor switching devices of said "N" poles for storing semiconductor switching loss energy;

a first controllable semiconductor recovery switch means having a conductive state and non-conductive state;

a second controllable semiconductor recovery switch means having a conductive state and non-conductive state;

diode means connected one-for-one with a respective snubber circuit associated with said controllable semiconductor switching device of each of the "N" poles of the inverter, said diode means being connected to said first and second recovery switch means such that a snubber capacitor discharges through its associated diode when one of said first and second recovery switch means is made conductive at the same time that a controllable semiconductor switching device of the corresponding pole of said "N" poles is made conductive, said first recovery switch means being operable to discharge a snubber capacitor of a snubber circuit corresponding to the controllable semiconductor switching device conducting a positive polarity voltage to the output of the inverter and the second recovery switch means being operable to: discharge a snubber capacitor of a snubber circuit corresponding to the controllable semiconductor switching device conducting a negative polarity voltage to the inverter output, said controllable semiconductor switching devices associated with each of said "N" poles becoming conductive sequentially at predetermined timed intervals during a conduction period of said first and second recovery switch means;

an inductor having one end coupled to said first and second recovery switches;

a capacitor divider circuit means connected between said positive and negative DC voltage buses, respectively, said capacitor divider circuit means further comprising a first and second capacitor in a series circuit arrangement and defining a junction at the connection between said first and second capacitors wherein the opposite end of each of said inverter inductors is connected to said capacitor junction to deliver in a staggered time sequence a pulse of current to said capacitor divider circuit each time one of said snubber capacitors is discharged.

6. A resonant recovery circuit for returning semiconductor switching device loss energy from a snubber circuit to a DC voltage supply potential powering the semiconductor switching device, said recovery circuit comprising:

a split DC voltage supply means for supplying a positive DC voltage bus and a negative DC voltage bus;

a first controllable semiconductor recovery switch means including a first terminal connected to the positive DC voltage bus, and including a second terminal, the first recovery switch having a conductive state and non-conductive state;

a second controllable semiconductor recovery switch means including a first terminal connected to the negative DC voltage bus, and including a second terminal, the second recovery switch having a conductive state and non-conductive state;

a first recovery diode having a cathode connected to the second terminal of the first recovery switch, and having an anode connected to the negative DC voltage bus;

a second recovery diode having an anode connected to the second terminal of the second recovery switch, and having a cathode connected to the positive DC bus;

a first snubber capacitor having first and second terminals, the first terminal connected to the positive DC voltage bus;

a first snubber diode including an anode connected to the second terminal of the first snubber capacitor at a first junction, the first terminal of the first snubber capacitor and the cathode of the first snubber diode to be respectively connected to terminals of a first controllable switching device;

a second snubber capacitor having first and second terminals, the first terminal connected to the negative DC voltage bus;

a first snubber diode including an cathode connected to the second terminal of the second snubber capacitor at a second junction, the first terminal of the second snubber capacitor and the anode of the second snubber diode to be respectively connected to terminals of a second controllable switching device;

the cathode of the first recovery diode connected to the anode of the second recovery diode at an output junction;

a first recovery inductor connected between the first junction and the second terminal of the first recovery switch; and a second recovery inductor connected between the second junction and the second terminal of the second recovery switch;

during a negative half cycle at the output junction, when the second switching device is turned off by control circuitry, the second snubber capacitor charging through the second snubber diode to the positive DC voltage to maintain a low voltage across the second switching device which is maintained until the next on pulse when the second switching device and the second recovery switch are turned on by control circuitry, the energy stored in the capacitor then being transferred to the second inductor such that when the energy stored in the second snubber capacitor is about equal to the energy transferred to the second inductor, the second recovery switch being turned off to allow the energy originally stored in the second snubber capacitor to be transferred to the DC supply; and during a positive half cycle at the output junction when the first switching device is turned off by control circuitry, the first snubber capacitor charging through the first snubber diode to the positive DC voltage to maintain a low voltage across the first switching device which is maintained until the next on pulse when the first switching device and the first recovery switch are turned on by control circuitry, the energy stored in the capacitor then being transferred to the first inductor such that when the energy stored in the first snubber capacitor is about equal to the energy transferred to the first inductor, the first recovery switch being turned off to allow the energy originally stored in the first snubber capacitor to be transferred to the DC supply.

7. A staggered resonant recovery circuit for returning semiconductor switching device loss energy from a snubber circuit of an AC to DC inverter to a DC voltage supply potential powering the semiconductor switching device, said circuit comprising:

a DC voltage supply means for supplying a positive DC voltage bus and a negative DC voltage bus relative to the positive DC voltage bus;

a first controllable semiconductor recovery switch means having first and second conductor terminals, the first recovery switch having a conductive state and non-conductive state;

a second controllable semiconductor recovery switch having first and second conductor terminals, the second recovery switch having a conductive state and non-conductive state;

a first recovery diode having a cathode connected to the first terminal of the first recovery switch, and having an anode connected to the negative DC voltage bus;

a second recovery diode having an anode connected to the first terminal of the second recovery switch, and having a cathode connected to the positive DC bus;

a first recovery inductor having a first end connected to the positive DC bus, and having a second end connected to the first terminal of the first recovery switch;

a second recovery inductor having a first end connected to the negative DC bus, and having a second end connected to the first terminal of the second recovery switch;

the first recovery switch, the first recovery diode and the first recovery inductor cooperating to form as first recovery circuit to return energy to the DC bus line during a positive half cycle of the AC output of an AC to DC inverter, the second recovery switch, the second recovery diode and the second recovery inductor cooperating to form a second recovery circuit to return energy to the DC bus line during a negative half cycle of the AC output of an AC to DC inverter;

an inverter phase circuit to communicate with an inverter power pole, the phase circuit including:

a first snubber capacitor having first and second terminals, the first terminal connected to the positive DC voltage bus;

a first snubber diode including an anode connected to the second terminal of the first snubber capacitor at a first power pole junction, the first terminal of the first snubber capacitor and the cathode of the first snubber diode to be respectively connected to terminals of a first controllable power pole switching device;

a second snubber capacitor having first and second terminals, the first terminal connected to the negative DC voltage bus;

a second snubber diode including a anode connected to the second terminal of the second snubber capacitor at a second power pole junction, the first terminal of the second snubber capacitor and the cathode of the second snubber diode to be respectively connected to terminals of a second controllable power pole switching device;

a first connecting diode having a cathode connected to the second terminal of the first recovery switch, and having an anode to be connected to the first power pole junction;

a second connecting diode having an anode connected to the second terminal of the second recovery switch, and having a cathode to be connected to the second power pole junction;

during a negative half cycle at the output junction, when the second switching device is turned off by the control circuitry with the second snubber capacitor charged, the second snubber diode becoming reverse biased and the second connecting diode to become forward biased such that the voltage potential at the second power pole junction falls to minus Vdc relative to the negative DC bus and becomes the input to the recovery circuit, the second recovery switch being turned on by the control circuitry to build up a current in the second recovery inductor flowing from the negative DC bus through the second power pole switch, through the second snubber capacitor, through the second connecting diode, through the second recovery switch and the second recovery inductor to return to the negative DC bus; and during a positive half cycle at the output junction, the current returning to the positive DC bus in substantially the same way as that during the negative cycle by corresponding components associated with the first power pole.

8. A system including a staggered resonant recovery circuit for returning semiconductor switching device loss energy from a snubber circuit of an AC to DC inverter to a DC voltage supply potential powering the semiconductor switching device, said system comprising:

a DC voltage supply means for supplying a positive DC voltage bus and a negative DC voltage bus relative to the positive DC voltage bus;

a clock and control circuit for controlling the actuation and timing of the resonant recovery circuit and switching devices of the inverter;

a first controllable semiconductor recovery switch means having first and second conductor terminals, the first recovery switch having a conductive state and non-conductive state;

a second controllable semiconductor recovery switch having first and second conductor terminals, the second recovery switch having a conductive state and non-conductive state;

a first recovery diode having a cathode connected to the first terminal of the first recovery switch, and having an anode connected to the negative DC voltage bus;

a second recovery diode having an anode connected to the first terminal of the second recovery switch, and having a cathode connected to the positive DC bus;

a first recovery inductor having a first end connected to the positive DC bus, and having a second end connected to the first terminal of the first recovery switch;

a second recovery inductor having a first end connected to the negative DC bus, and having a second end connected to the first terminal of the second recovery switch;

the first recovery switch, the first recovery diode and the first recovery inductor cooperating to form a first recovery circuit to return energy to the DC bus line during a positive half cycle of the AC output of an AC to DC inverter, the second recovery switch, the second recovery diode and the second recovery inductor cooperating to form a second recovery circuit to return energy to the DC bus line during a negative half cycle of the AC output of an AC to DC inverter;

an inverter phase circuit comprising an inverter power pole, each set of power poles including:

a first snubber capacitor having first and second terminals, the first terminal connected to the positive DC voltage bus;

a first snubber diode including an anode connected to the second terminal of the first snubber capacitor at a first power pole junction, the first terminal of the first snubber capacitor and the cathode of the first snubber diode to be respectively connected to terminals of a first controllable power pole switching device;

a second snubber capacitor having first and second terminals, the first terminal connected to the negative DC voltage bus;

a second snubber diode including a anode connected to the second terminal of the second snubber capacitor at a second power pole junction, the first terminal of the second snubber capacitor and the cathode of the second snubber diode to be respectively connected to terminals of a second controllable power pole switching device;

a first connecting diode having a cathode connected to the second terminal of the first recovery switch, and having an anode to be connected to the first power pole junction;

a second connecting diode having an anode connected to the second terminal of the second recovery switch, and having a cathode to be connected to the second power pole junction;

during a negative half cycle at the output junction, when the second switching device is turned off by the control circuitry with the second snubber capacitor charged, the second snubber diode becoming reverse biased and the second connecting diode to become forward biased such that the voltage potential at the second power pole junction fails to minus Vdc relative to the negative DC bus and becomes the input to the recovery circuit, the second recovery switch being turned on by the control circuitry to build up a current in the second recovery inductor flowing from the negative DC bus through the second power pole switch, through the second snubber capacitor, through the second connecting diode, through the second recovery switch and the second recovery inductor to return to the negative DC bus; and during a positive half cycle at the output junction, the current returning to the positive DC bus in substantially the same way as that during the negative cycle by corresponding components associated with the first power pole.

9. A system as defined in claim 8, wherein the inverter further comprises:

a second power pole;

a second inverter phase circuit including:

a third snubber capacitor having first and second terminals, the first terminal connected to the positive DC voltage bus;

a third snubber diode including an anode connected to the second terminal of the third snubber capacitor at a third power pole junction, the first terminal of the third snubber capacitor and the cathode of the third snubber diode to be respectively connected to terminals of a third controllable power pole switching device;

a fourth snubber capacitor having first and second terminals, the first terminal connected to the negative DC voltage bus;

a fourth snubber diode including an anode connected to the second terminal of the fourth snubber capacitor at a fourth power pole junction, the first terminal of the fourth snubber capacitor and the cathode of the fourth snubber diode to be respectively connected to terminals of a fourth controllable power pole switching device;

a third connecting diode having a cathode connected to the second terminal of the first recovery switch, and having an anode to be connected to the third power pole junction;

a fourth connecting diode having an anode connected to the second terminal of the second recovery switch, and having a cathode to be connected to the fourth power pole junction, the first and second power poles to be actuated in a staggered sequence relative to one another by the control circuitry.

10. A system as defined in claim 8, wherein the inverter is three-phase, the system further comprising:

a second power pole including third and fourth power pole switching devices for generating the second phase of the inverter;

a second inverter phase circuit associated with the second power pole, comprising:

a third snubber capacitor having first and second terminals, the first terminal connected to the positive DC voltage bus;

a third snubber diode including an anode connected to the second terminal of the third snubber capacitor at a third power pole junction, the first terminal of the third snubber capacitor and the cathode of the third snubber diode to be respectively connected to terminals of the third controllable power poles switching device;

a fourth snubber capacitor having first and second terminals, the first terminal connected to the negative DC voltage bus;

a fourth snubber diode including an anode connected to the second terminal of the fourth snubber capacitor at a fourth power pole junction, the first terminal of the fourth snubber capacitor and the cathode of the fourth snubber diode to be respectively connected to terminals of the fourth controllable power pole switching device;

a third connecting diode having a cathode connected to the second terminal of the first recovery switch, and having an anode to be connected to the third power pole junction;

a fourth connecting diode having an anode connected to the second terminal of the second recovery switch, and having a cathode to be connected to the fourth power pole junction;

a third power pole including fifth and sixth power pole switching devices for generating the third phase of the inverter;

a third inverter phase circuit associated with the third power pole, comprising:

a fifth snubber capacitor having first and second terminals, the first terminal connected to the positive DC voltage bus;

a fifth snubber diode including an anode connected to the second terminal of the fifth snubber capacitor at a fifth power pole junction, the first terminal of the fifth snubber capacitor and the cathode of the fifth snubber diode to be respectively connected to terminals of the fifth controllable power pole switching device;

a sixth snubber capacitor having first and second terminals, the first terminal connected to the negative DC voltage bus;

a sixth snubber diode including an anode connected to the second terminal of the sixth snubber capacitor at a sixth power pole junction, the first terminal of the sixth snubber capacitor and the cathode of the sixth snubber diode to be respectively connected to terminals of the sixth controllable power pole switching device;

a fifth connecting diode having a cathode connected to the second terminal of the first recovery switch, and having an anode to be connected to the fifth power pole junction; and a sixth connecting diode having an anode connected to the second terminal of the second recovery switch, and having a cathode to be connected to the sixth power pole junction.

* * * * *

UNITED STATES PATENT AND TRADEMARK OFFICE
CERTIFICATE OF CORRECTION

PATENT NO. : 5,576,943
DATED : November 19, 1996
INVENTOR(S) : Alexander Stuart Keir It is certified that error appears in the above-indentified patent and that said Letters Patent is hereby corrected as shown below:

Claim 3:

On line 48, please delete "divide" and substitute --divider--.

Claim 5:

On line 33, after "to", please delete ":".

Signed and Sealed this

Eighteenth Day of February, 1997

Attest:

BRUCE LEHMAN

Attesting Officer

Commissioner of Patents and Trademarks